(12) United States Patent
Kim et al.

(10) Patent No.: US 7,442,649 B2
(45) Date of Patent: Oct. 28, 2008

(54) ETCH WITH PHOTORESIST MASK

(75) Inventors: Jisoo Kim, Pleasanton, CA (US);
Sangheon Lee, Sunnyvale, CA (US);
Binet A. Worsham, San Jose, CA (US);
Robert Charatan, Portland, OR (US);
S.M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 433 days.

(21) Appl. No.: 11/094,559

(22) Filed: Mar. 29, 2005

(65) Prior Publication Data

US 2006/0223327 A1 Oct. 5, 2006

(51) Int. Cl.
*H01L 21/302* (2006.01)
*H01L 21/461* (2006.01)

(52) U.S. Cl. .............................. 438/710; 257/E21.252

(58) Field of Classification Search ................ 438/710; 257/E21.252
See application file for complete search history.

(56) References Cited

U.S. PATENT DOCUMENTS

| | | | | |
|---|---|---|---|---|
| 4,522,681 A * | 6/1985 | Gorowitz et al. | ............ | 438/713 |
| 4,793,897 A * | 12/1988 | Dunfield et al. | ............. | 438/724 |
| 4,892,753 A * | 1/1990 | Wang et al. | ............... | 427/579 |
| 4,904,341 A | 2/1990 | Blaugher et al. | | |
| 4,956,312 A * | 9/1990 | Van Laarhoven | ............ | 438/639 |
| 6,001,538 A | 12/1999 | Chen et al. | | |
| 6,686,293 B2 * | 2/2004 | Kim et al. | ............... | 438/711 |
| 7,001,833 B2 * | 2/2006 | Bao et al. | ................... | 438/597 |
| 2002/0076935 A1 | 6/2002 | Maex et al. | | |
| 2003/0109143 A1 | 6/2003 | Hsieh et al. | | |
| 2003/0211750 A1 | 11/2003 | Kim et al. | | |
| 2004/0063308 A1 * | 4/2004 | Bao et al. | ................... | 438/637 |
| 2005/0026430 A1 * | 2/2005 | Kim et al. | ................... | 438/689 |
| 2005/0048787 A1 | 3/2005 | Negishi et al. | | |

FOREIGN PATENT DOCUMENTS

EP 1503405 2/2005
JP 03060121 3/1991

OTHER PUBLICATIONS

International Search Report, dated Sep. 11, 2006.

* cited by examiner

*Primary Examiner*—Bradley W. Baumeister
*Assistant Examiner*—Igwe U. Anya
(74) *Attorney, Agent, or Firm*—Beyer Law Group LLP

(57) ABSTRACT

A method for etching a dielectric layer over a substrate is provided. A photoresist mask is formed over the dielectric layer. The substrate is placed in a plasma processing chamber. An etchant gas comprising $NF_3$ is provided into the plasma chamber. A plasma is formed from the $NF_3$ gas. The dielectric layer is etched through the photoresist mask with the plasma from the $NF_3$ gas.

12 Claims, 4 Drawing Sheets

ETCH WITH PHOTORESIST MASK

BACKGROUND OF THE INVENTION

The present invention relates to the use of a photoresist mask in semiconductor device production. More particularly, the present invention relates to etching a dielectric layer through a photoresist mask during the production of a semiconductor device.

During semiconductor wafer processing, features of the semiconductor device are defined in the wafer using well-known patterning and etching processes. In these processes, a photoresist (PR) material may be deposited on the wafer and then is exposed to light filtered by a reticle. The reticle may be a transparent plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby produce the desired features in the wafer.

To provide increased density, feature size is reduced. This may be achieved by reducing the critical dimension (CD) of the features, which requires improved photoresist resolution. One way of improving photoresist resolution is by providing thinner photoresist masks.

New photoresist materials (193 and 157 nm PR) are being pursued to produce small CD sizes in the photoresist, but these resists are less resistant to damage from the plasma than previous masks of DUV and 248 nm photoresist. Also, with the current single layer approach, increasingly thinner resist must be used to match the resolution of the features. This may not provide enough resist for the dielectric etch and may cause other complications, such as striation, line edge roughness, and line wiggling. In order to keep up with shrinking feature dimensions, the industry has been investigating new technologies such as multi-layer approaches involving several processing steps. The switch to new technologies will undoubtedly be expensive and time-consuming.

In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. A number of promising materials, which are sometimes referred to as "low-k materials", have been developed. In the specification and claims, low-k materials are defined as materials with a dielectric constant k that is less than 4. Fluorosilicate glass is one example of a low-k dielectric, which has a dielectric constant of about 3.7. This composes an about 7-9% fluorine doped into $SiO_2$.

There are several kinds of low-k materials currently being developed and in use in the semiconductor industry, i.e. fluorinated silicon oxyfluoride (FSG), hydrogen silsesquioxane (HSQ), spin-on organic materials (Dow's SiLK™ is a non-fluorinated, highly aromatic, organic spin-on polymer with a reported k of 2.65), and inorganic systems deposited by chemical vapor deposition (CVD) such as organosilicate glass. By way of example, but not limitation, such organosilicate dielectrics include CORAL™ from Novellus of San Jose, Calif.; Black Diamond™ from Applied Materials of Santa Clara, Calif.; Aurora™ available from ASM International N.V., The Netherlands; Sumika Film® available from Sumitomo Chemical America, Inc., Santa Clara, Calif., and HOSP™ from Allied Signal of Morristown, N.J. Organosilicate glass materials have carbon and hydrogen atoms incorporated into the silicon dioxide lattice which lowers the density, and hence the dielectric constant of the material. A dielectric constant for such films is typically <3.0.

SUMMARY OF THE INVENTION

To achieve the foregoing and in accordance with the purpose of the present invention a method for etching a dielectric layer over a substrate is provided. A photoresist mask is formed over the dielectric layer. The substrate is placed in a plasma processing chamber. An etchant gas comprising $NF_3$ is provided into the plasma chamber. A plasma is formed from the $NF_3$ gas. The dielectric layer is etched through the photoresist mask with the plasma from the $NF_3$ gas.

In another manifestation a method for etching a dielectric layer over a substrate is provided. A photoresist mask no more than 400 nm thick is formed over the dielectric layer. The substrate is placed in a plasma processing chamber. An etchant gas consisting essentially of $NF_3$ and a diluent is provided into the plasma chamber. A plasma is formed from the $NF_3$ gas. The dielectric layer is etched through the photoresist mask with the plasma from the $NF_3$ gas.

In another manifestation an apparatus for forming a features in an etch layer, wherein the layer is supported by a substrate and wherein the etch layer is covered by a photoresist mask is provided. A plasma processing chamber is provided. The plasma processing chamber comprises a chamber wall forming a plasma processing chamber enclosure, substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source comprising an $NF_3$ source is in fluid connection with the gas inlet. A controller is controllably connected to the gas source and the at least one electrode and comprises at least one processor and computer readable media. The computer readable media comprises computer readable code for providing $NF_3$ gas from the $NF_3$ source into the plasma processing chamber, computer readable code for generating a plasma from the $NF_3$ gas, and computer readable code for providing plasma conditions to cause the etching of an etch layer with the plasma from the $NF_3$ gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
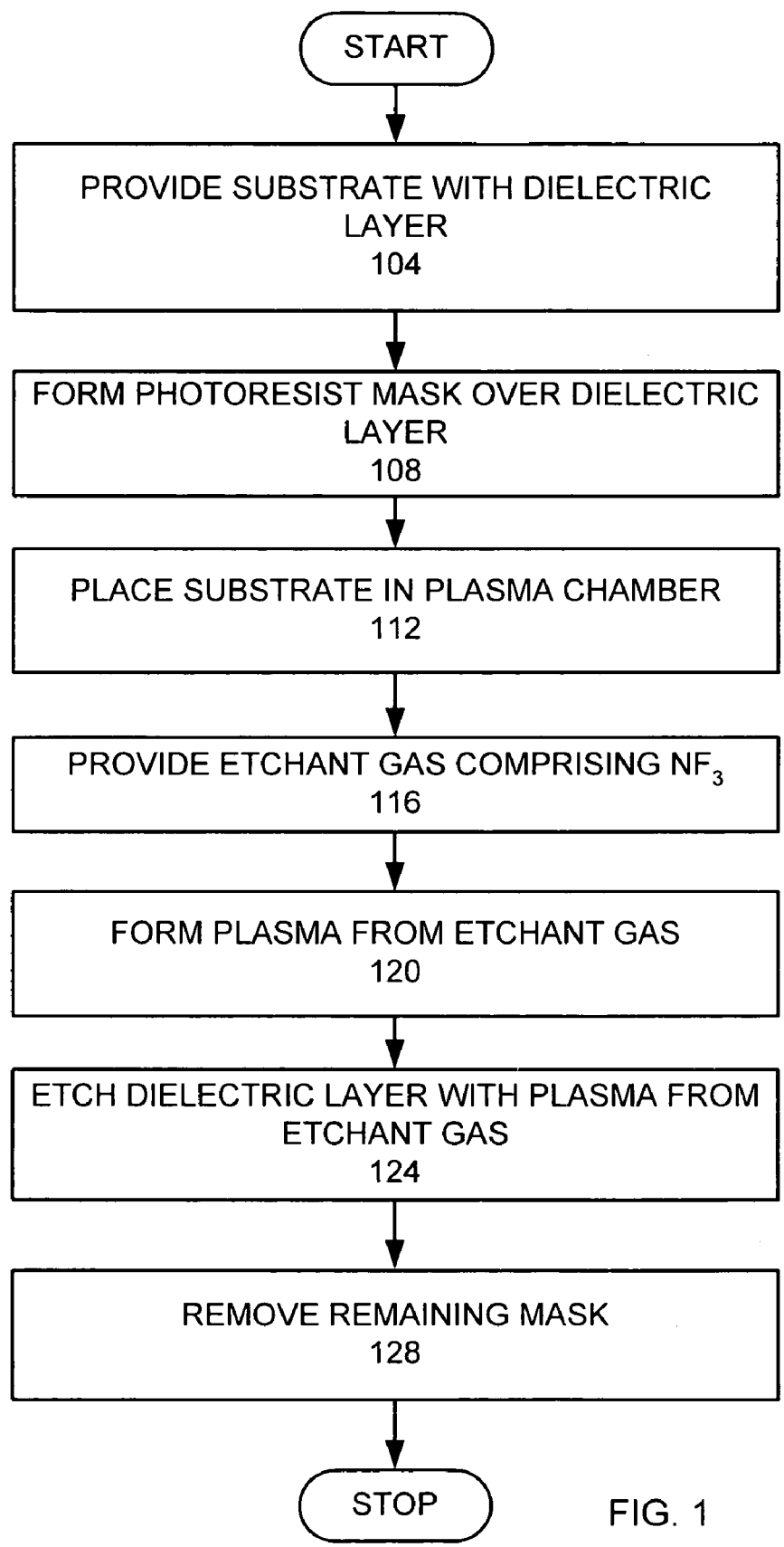
FIG. 1 is a flow chart of an embodiment of the invention.

To facilitate understanding, FIG. 1 is a high level flow chart of a process used in an embodiment of the invention. A substrate with a dielectric layer is provided (step 104). A photoresist mask is formed over the dielectric layer (step 108). The substrate is placed in a plasma chamber (step 112). An etchant gas comprising $NF_3$ is provided to the plasma chamber (step 116). Plasma is formed from the etchant gas (step 120). The plasma formed from the etchant gas is used to etch the dielectric layer (step 124). Remaining photoresist mask is then removed (step 128).

EXAMPLE

Figure 2A:
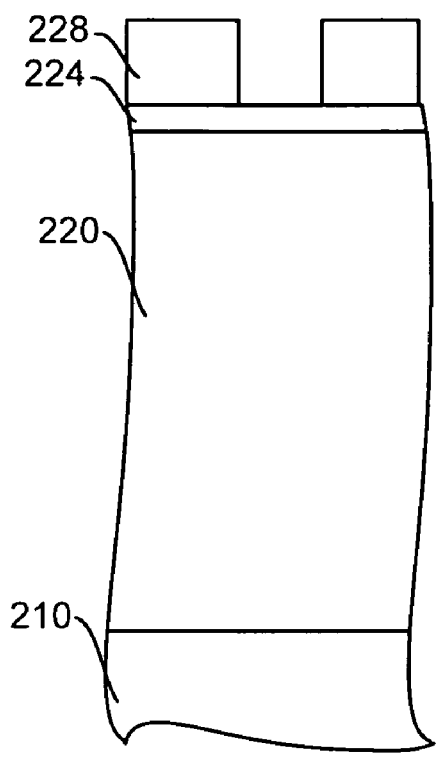
FIGS. 2A-B are schematic views of layers etched in an embodiment of the invention.

To facilitate understanding of the invention, FIG. 2A is a cross-sectional illustration of a substrate 210 with a dielectric layer 220 that is provided (step 104). In an example of a preferred embodiment of the invention, the substrate 210 is a silicon wafer and the dielectric layer 220 is organo silicate glass, which is a silicon oxide based low-k dielectric material. In the preferred embodiment, the ARC layer, which is preferably a bottom antireflective coating (BARC) 224, is placed over the dielectric layer 220. A photoresist mask 228, which is preferably 193 nm photoresist, is formed over the dielectric layer 220 (step 108). Preferably, the mask has a thickness of no more than 400 nm. Via patterning uses mask thicknesses of about 400 nm. Trench patterning uses mask thicknesses of about 200 nm. More preferably, the mask has a thickness of no more than 200 nm. The substrate 210 is placed in an plasma processing chamber (step 112).

Figure 3:
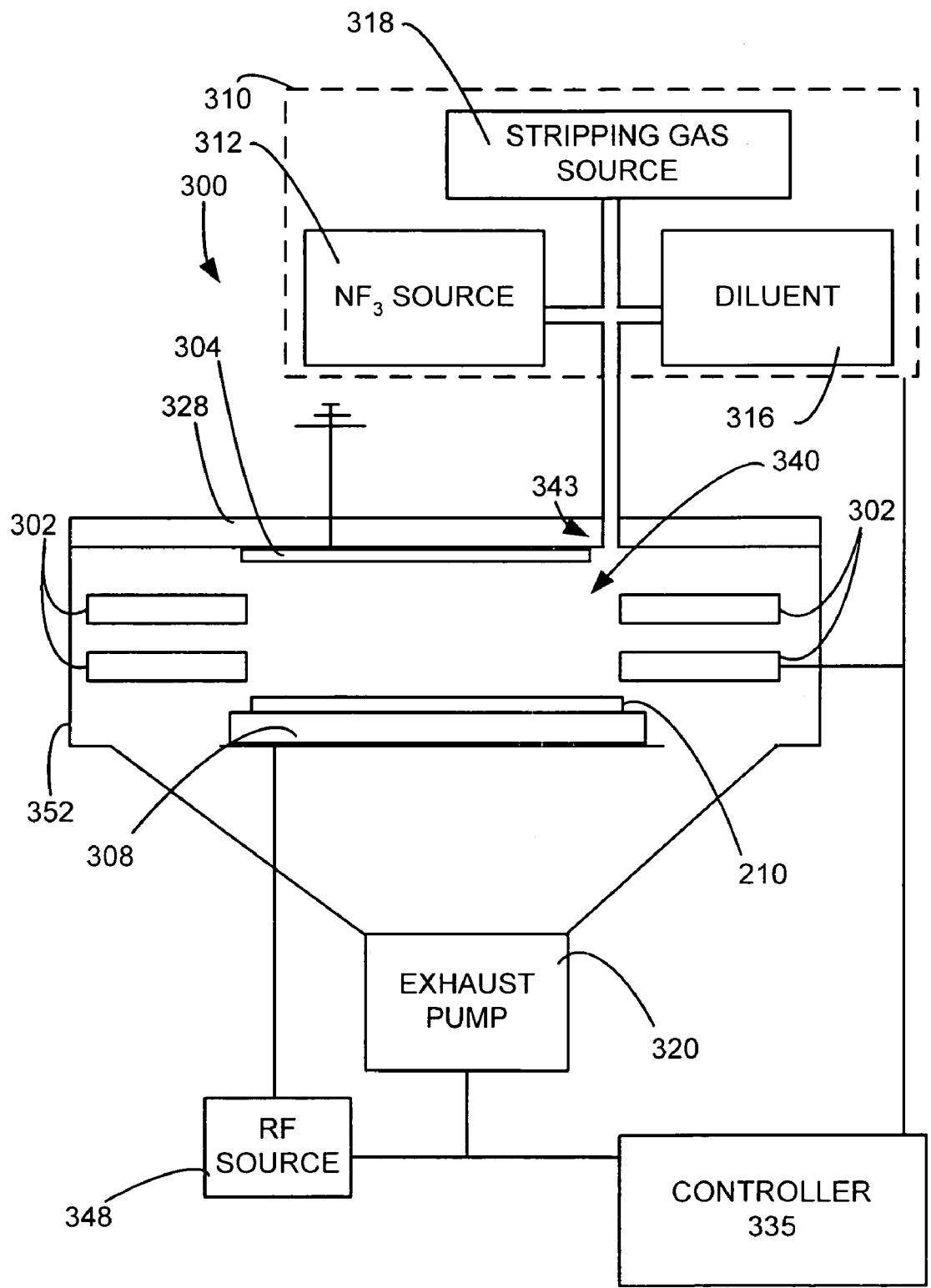
FIG. 3 is a schematic view of a plasma processing chamber that may be used for etching.

FIG. 3 is a schematic view of a plasma processing chamber 300 that may be used for inventive etching. The plasma processing chamber 300 comprises confinement rings 302, an upper electrode 304, a lower electrode 308, a gas source 310, and an exhaust pump 320. Within plasma processing chamber 300, the substrate 210 is positioned upon the lower electrode 308. The lower electrode 308 incorporates a suitable substrate chucking mechanism (e.g., electrostatic, mechanical clamping, or the like) for holding the substrate 210. The reactor top 328 incorporates the upper electrode 304 disposed immediately opposite the lower electrode 308. The upper electrode 304, lower electrode 308, and confinement rings 302 define the confined plasma volume. Gas is supplied to the confined plasma volume by the gas source 310 and is exhausted from the confined plasma volume through the confinement rings 302 and an exhaust port by the exhaust pump 320. In this embodiment, the gas source 310 comprises an $NF_3$ source 312, a diluent source 316, and a stripping gas source 318. The gas source 310 may further comprise other gas sources. An RF source 348 is electrically connected to the lower electrode 308. Chamber walls 352 surround the confinement rings 302, the upper electrode 304, and the lower electrode 308. Different combinations of connecting RF power to the electrode are possible. In a preferred embodiment of the invention, the 27 MHz, and 2 MHz power sources make up the RF power source 348 connected to the lower electrode, and the upper electrode is grounded. A controller 335 is controllably connected to the RF source 348, exhaust pump 320, and the gas source 310.

Figure 4A:
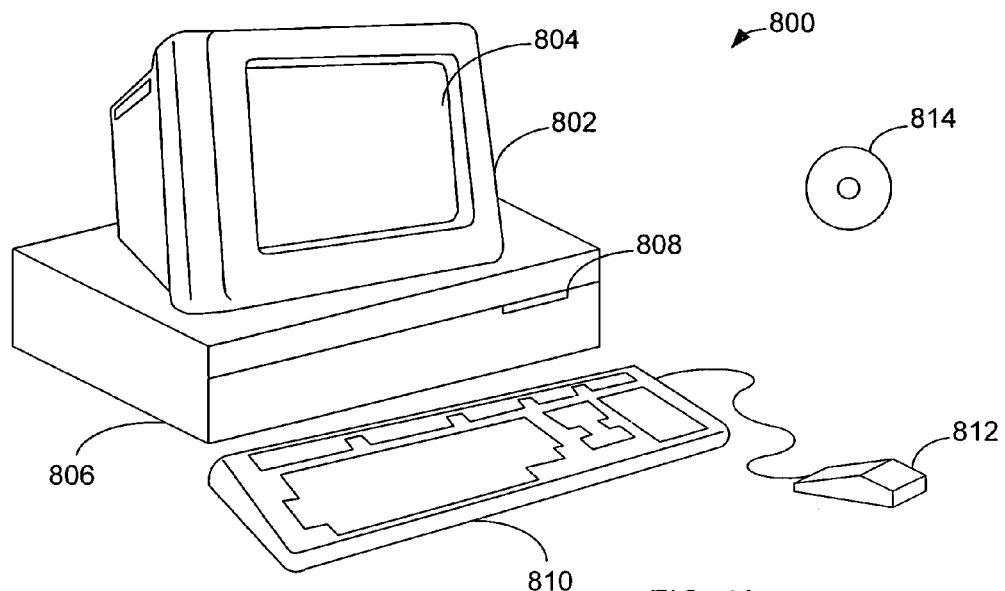
FIGS. 4A-B illustrate a computer system, which is suitable for implementing a controller used in embodiments of the present invention.
Figure 4B:
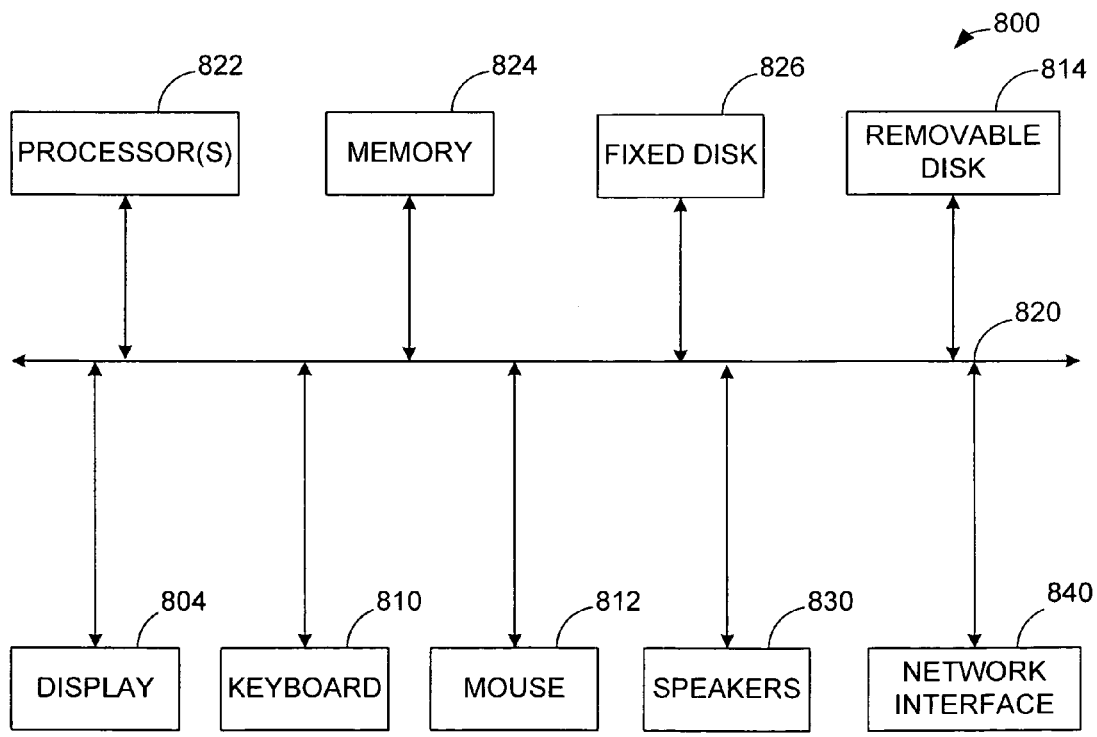

FIGS. 4A and 4B illustrate a computer system 800, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 4B is an example of a block diagram for computer system 800. Attached to system bus 820 are a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of the computer-readable media described below.

CPU 822 is also coupled to a variety of input/output devices, such as display 804, keyboard 810, mouse 812, and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

An etchant gas comprising $NF_3$ is provided to the plasma chamber 300 (step 116). In an example, the etchant gas comprises $NF_3$ and an inert gas, such as Ar. For example, the etchant gas may be 60 sccm $NF_3$ and 100 sccm Ar. As in this example, preferably, the etchant gas is free of fluorocarbons and hydrofluorocarbons.

Figure 2B:
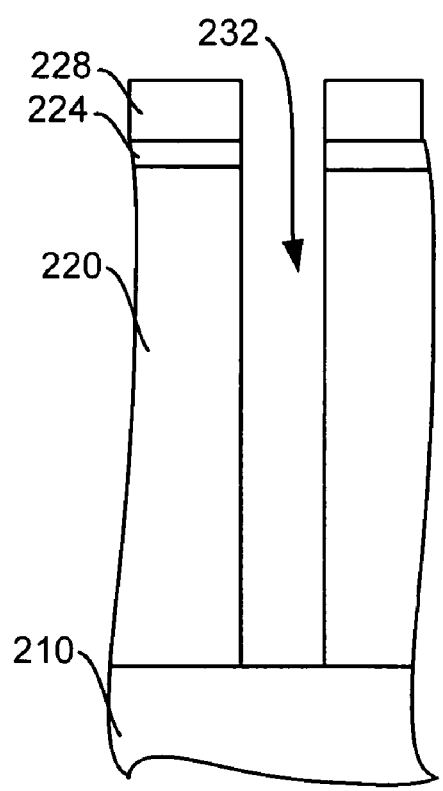

The etchant gas is converted to a plasma (step 120). In this example the pressure in the plasma chamber is set at 120 mTorr. The RF source provides 500 Watts at 27 MHz and 100 Watts at 2 MHz. The plasma from the etchant gas is used to etch features 232 into the dielectric layer 220, as shown in FIG. 2B (step 124). An ashing process may be used to remove the remaining photoresist mask, while the substrate is in the plasma processing chamber (step 128).

The invention may be used to etch a variety of dielectric materials. The invention may be used to etch silicon oxide based dielectric materials, such as silicon oxide and organo silicate glass. In another manifestation of the invention, the invention may be used to etch low-k dielectrics, which may be either organic based or silicon oxide based. Examples of organic based low-k dielectrics that may be etched by the invention are SiLk and organo silicate glass.

Preferably, the invention uses a photoresist of 193 nm or above. Such photoresists tend to have a low carbon to hydrogen ratio (C/H ratio) and are less etch resistant.

Photoresist selectivity is defined by the etch rate of the dielectric layer divided by the etch rate of the photoresist. Generally, photoresist selectivity may be increased by lowering the photoresist etch rate. The inventive $NF_3$ etch is believed to increase the photoresist etch rate, but increases photoresist selectivity by increasing the dielectric etch rate more than the increase in the photoresist etch rate.

Conventional etches would lower photoresist etch rate by depositing carbon or polymer on the photoresist before or during the etch. Such processes would cause microloading between patterns. Such microloading would cause uneven etching between areas with closely spaced features and areas with more distantly spaced features.

The inventive process using only an $NF_3$ etchant with no hydrocarbon, fluorocarbon, or hydrofluorocarbon component does not seem to deposit carbon or polymer and therefore does not cause microloading.

In addition, the inventive process may reduce or eliminate photoresist wiggling. Photoresist wiggling is caused by a distortion or bending of the photoresist mask material. The bent or distorted photoresist mask causes irregularly shaped features. It is believed that such distortion or bending of the photoresist mask material is caused by protective layers, hydrofluorocarbon polymer, put on the photoresist mask to reduce the photoresist etch rate. Such protective layers of carbon or polymer apply a force to the photoresist mask, which causes the photoresist mask to bend or distort.

This process may be used to reduce line edge roughness and striation, since line edge roughness and striation is generally cased by uneven polymer deposition on during etch process.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching a low-k dielectric layer over a substrate, comprising:
   forming a photoresist mask over the low-k dielectric layer;
   placing the substrate in a plasma processing chamber:
   providing an etchant gas consisting essentially of $NF_3$ and an inert diluent into the plasma chamber;
   forming a plasma from the etchant gas; and
   etching the dielectric layer through the photoresist mask with the plasma from the etchant gas.

2. The method, as recited in claim 1, wherein the inert diluent is arson.

3. The method, as recited in claim 2, wherein the dielectric layer is a silicon oxide based dielectric layer.

4. The method, as recited in claim 3, wherein the silicon oxide based dielectric layer is organosilicate glass.

5. The method, as recited in claim 4, wherein the forming the photoresist/mask forms the photoresist mask to a thickness of no more than 400 nm.

6. The method, as recited in claim 4, wherein the forming the photoresist mask forms the photoresist mask to a thickness of no more than 200 nm.

7. A semiconductor device made by the method of claim 1.

8. A method for etching a dielectric layer over a substrate comprising:
   forming a photoresist mask no more than 400 nm thick over the dielectric layer;
   placing the substrate in a plasma processing chamber;
   providing an etchant gas consisting essentially of and a diluent into the plasma chamber;
   forming a plasma from the $NF_3$ gas; and
   etching the dielectric layer through the photoresist mask with the plasma from the $NF_3$ gas.

9. The method, as recited in claim 8, wherein the dielectric layer is a low-k dielectric layer.

10. The method, as recited in claim 8, wherein the dielectric layer is a silicon oxide based dielectric layer.

11. The method, as recited in claim 8, wherein the dielectric layer is a organosilicate glass.

12. The method, as recited in claim 8, wherein the inert diluent is argon.

\* \* \* \* \*